United States Patent
Ong et al.

(10) Patent No.: US 7,465,354 B2
(45) Date of Patent: Dec. 16, 2008

(54) PATTERNED FERROELECTRIC THIN FILMS FOR MICROWAVE DEVICES

(75) Inventors: Chong Kim Ong, Singapore (SG); Chin Yaw Tan, Singapore (SG)

(73) Assignee: National University of Singapore, Singapore (SG)

( * ) Notice: Subject to any disclaimer, the term of this patent is extended or adjusted under 35 U.S.C. 154(b) by 416 days.

(21) Appl. No.: 11/074,417

(22) Filed: Mar. 8, 2005

(65) Prior Publication Data

US 2006/0201415 A1    Sep. 14, 2006

(51) Int. Cl.
*C30B 25/04* (2006.01)
(52) U.S. Cl. .............. 117/95; 117/84; 117/88; 117/94; 117/97; 117/949; 117/947
(58) Field of Classification Search .......... 117/84, 117/88, 94, 95, 97, 949, 947
See application file for complete search history.

(56) References Cited

U.S. PATENT DOCUMENTS 5,350,606 A * 9/1994 Takada et al. ............... 427/564

2001/0012567 A1 * 8/2001 Saitoh et al. ............... 428/472
2002/0084456 A1 * 7/2002 Sugihara et al. .............. 257/48

OTHER PUBLICATIONS

M.J. Lancaster et al., "Thin-film ferroelectric microwave devices", Supercond. Sci. Tech. II (1998), pp. 1323-1334.
R.A. Chakalov et al., "Fabrication and investigation of $Yba_2Cu_3O_{7-\delta}/Ba_{0.05}Sr_{0.95}TiO_3$ thin film structures for voltage tunable devices", Physica C, 308 (1998) pp. 279-288.
F.A. Miranda et al., "Design and Development of Ferroelectric Tunable Microwave Components for Ku- and K-Band Satellite Communication Systems", IEEE Trans. on Microwave Theory and Tech., vol. 48, No. 7, Jul. 2000, pp. 1181-1189.

* cited by examiner

*Primary Examiner*—Robert Kunemund
*Assistant Examiner*—Matthew J Song
(74) *Attorney, Agent, or Firm*—Saile Ackerman LLC; Stephen B. Ackerman

(57) ABSTRACT

A process, for patterning a thin film that is highly resistant to conventional etching processes and that is to be deposited at a high substrate temperature, is disclosed. The process uses a liftoff method wherein a refractory material has been substituted for the conventional organic resin. The method is particularly useful for the fabrication of tunable microwave devices and ferroelectric memory elements.

6 Claims, 6 Drawing Sheets

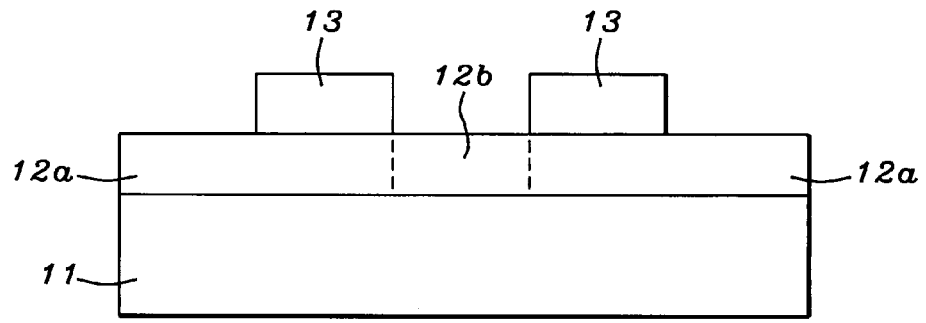
FIG. 1 - Prior Art
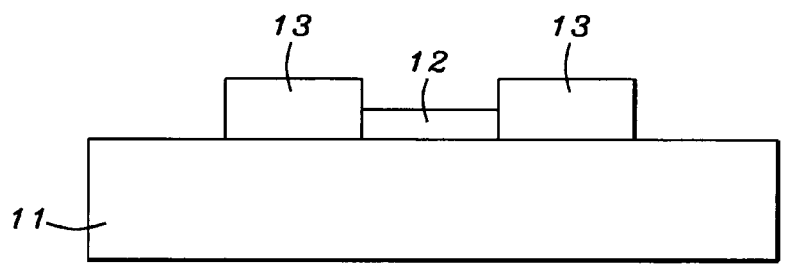
FIG. 2
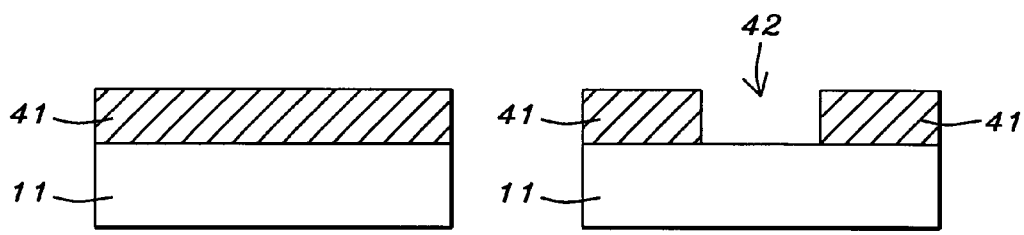
FIG. 3          FIG. 4

■ BST
▨ YBCO

PATTERNED FERROELECTRIC THIN FILMS FOR MICROWAVE DEVICES

FIELD OF THE INVENTION

The invention relates to electrically tunable ferroelectric thin film planar microwave devices, such as varactors, resonators, phase shifters, and filters, with particular reference to methods to manufacture such devices.

BACKGROUND OF THE INVENTION

Use of ferroelectric material for the tuning element is one way of achieving electrically tunable microwave devices such as varactors, resonators, filters and phase shifters, whose operating characteristic can be altered by applying an electric field. Ferroelectric thin film based tunable microwave devices have the advantages of high switching speed, compactness, light weight, low power consumption, and high reliability relative to competing technologies.

Tunable planar ferroelectric devices are usually implemented on a substrate whose entire surface is covered by a ferroelectric thin film. High temperature super-conductors are often used for the conductive layers to obtain better performances such as very low insertion loss. Ideally the ferroelectric thin film should be patterned so that it is present only on selected areas of a substrate 11 (FIG. 2), rather than on its entire surface (FIG. 1) so as to reduce insertion loss due to microwave dissipation in the ferroelectric thin film as well as unintentional tuning from regions of the ferroelectric thin film where tuning is not wanted.

In FIG. 1, ferroelectric layer 12 is seen to comprise two regions—12b where tuning of the device is intended to take place and 12a which extends outside of and away from 12. Unwanted tuning can occur in 12a where it is close to electrodes 13.

One approach to achieving ferroelectric thin films on only selected regions has been to use "drop-in" pieces of ferroelectric thin film that were grown on a separate substrate and subsequently attached to another substrate with the patterned conductive layer circuit. However this approach usually requires an unacceptably large fabrication error tolerance and greatly complicates the fabrication process.

Another approach that has been used in the prior art to achieve a patterned ferroelectric thin film on a substrate has been to use chemical etching or ion beam milling. However, patterning a ferroelectric layer by chemical etching presents problems as ferroelectric thin film materials are very inert and chemicals capable of etching them will also etch the substrate or/and the conductive layers.

Thus, conventional chemical etching processes or ion beam milling will lead to a damaged substrate surface and/or conductive layer, resulting in a fabricated device that has poor performance. This problem of damaging the substrate surface and/or the conductive layer is especially severe in cases where a high temperature super-conductor is used for the conducting layer(s).

Conventional lift-off processes for patterning the ferroelectric thin film using an organic photoresist masking layer are also unsuitable due to the high temperature required for the deposition of the ferroelectric thin film.

A routine search of the prior art was performed with the following references of interest being found:

1. M. J. Lancaster, J. Powell, and A. Porch, "Thin-film ferroelectric microwave devices", Supercond. Sci. Technol., 11 (1998), 1323-1334.
2. R. A. Chakalov et al, "Fabrication and investigation of $Yba_2Cu_3O_{7-\delta}/Ba_{0.05}Sr_{0.95}TiO_3$ thin film structures for voltage tunable devices", Physica C, 308 (1998), 279-288.
3. F. A. Miranda et al, "Design and Development of Ferroelectric Tunable Microwave Components for Ku- and K-Band Satellite Communication Systems", IEEE Trans. Microwave Theory Tech., 48 (2000), 1181-1189.

SUMMARY OF THE INVENTION

It has been an object of at least one embodiment of the present invention to provide a process for patterning a thin film that is highly resistant to conventional etching processes and that is to be deposited at a high substrate temperature.

Another object of at least one embodiment of the present invention has been to develop a fabrication process for electrically tunable microwave devices having patterned ferroelectric thin film tuning elements.

Still another object of at least one embodiment of the present invention has been to develop a fabrication process for a ferroelectric based memory element for use in a random access array.

These objects have been achieved by means of a method for fabricating patterned ferroelectric thin film based electrically tunable microwave devices without the problem of damaging either the substrate surface or conductive layers during the fabrication process of the device. The method involves deposition of a thermally stable masking material on a substrate; etching the masking material to reveal the required negative pattern for the ferroelectric thin film, deposition of the ferroelectric thin film, and removal of the masking material with accompanying liftoff of the unwanted regions of the ferroelectric thin film to produce the required ferroelectric thin film pattern.

A conductive layer, such as high temperature superconductor, can then be deposited on one or both sides of the substrate and patterned as required by the device design. The invention has the advantage of enabling the fabrication of a patterned ferroelectric thin film without degradation of either the substrate or conductive circuit layers, thereby improving the performance of the fabricated microwave devices. The invention also has the advantage of been readily incorporated into most fabrication processes used to fabricate ferroelectric thin films.

Possible applications of the invention are in the area of fabricating high performance tunable microwave devices required in modern microwave systems such as phase shifters used in phased array antennae (for radar tracking systems, multi-point communication systems and satellite broadcasting), tunable filters (for cellular base stations and relay satellites), tunable matching networks etc. The invention may also be applied to the manufacture of ferroelectric memory elements for use in random access arrays.

BRIEF DESCRIPTION OF THE DRAWINGS

FIG. 1 schematically illustrates a cross-sectional view of an unpatterned ferroelectric thin film for an electrically tunable microwave device of the prior art.

FIG. 2 schematically illustrates a cross-sectional view of a patterned ferroelectric thin film based electrically tunable microwave device, formed according to the teachings of the present invention.

FIGS. 3-8 illustrate the series of steps that are disclosed below as the process of the present invention.

DESCRIPTION OF THE PREFERRED EMBODIMENTS

Figure 5:
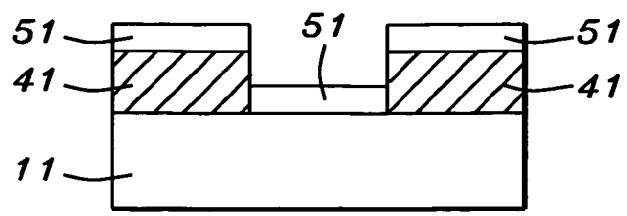

A layer of masking material, such as, but not limited to, $YBa_2Cu_3O_{7-\delta}$ (Yttrium barium cuprate or YBCO) is deposited on a substrate suitable for the epitaxial deposition of the ferroelectric and conductive thin films, such as $LaAlO_3$ (lanthanum aluminate or LAO) single crystal. The masking material should be thermally stable and able to be etched with an etchant that will not react with the substrate material. The thickness of the masking should be thicker than the required thickness of the ferroelectric thin film for better edge definition. The masking layer can be fabricated using thin film deposition technique such as pulsed laser deposition, sputtering, sol-gel process, chemical vapor deposition or any other thin film deposition method. In some cases, it may be necessary to deposit a masking layer on both faces of a substrate.

The masking layer, is then patterned by conventional photolithographic technique using an etchant that will not damage the substrate surface, for example diluted phosphoric ($H_3PO_4$) acid for YBCO thin film on LAO substrate. The pattern of the etched masking layer is a negative image of the required ferroelectric thin film pattern.

The required ferroelectric thin film, such as $Ba_xSr_{1-x}TiO_3$ (barium strontium titanate or BST) is deposited on the substrate with the patterned masking layer. Deposition of the ferroelectric can be carry out using thin film deposition technique such as pulsed laser deposition, sputtering, sol-gel process, chemical vapor deposition or any other thin film deposition method.

A key feature of the invention is that it enables the substrate to be processed at high deposition or annealing temperatures in the range required for producing ferroelectric thin film with optimum properties (temperatures of at least 650° C.). This becomes possible since the masking layer is thermally stable at these temperatures.

Upon completion of the deposition of the ferroelectric thin film, the remaining masking material is removed by etching with a chemical that will not damage the substrate surface, for example diluted acid such as phosphoric acid or nitric acid for a YBCO thin film on a LAO substrate with a BST ferroelectric thin film. Consequently, unwanted regions of the ferroelectric thin film are also removed, thereby leaving behind the required ferroelectric thin film pattern. This process may be supplemented by performing the etching in an ultrasonic bath.

A conductive layer (such as YBCO superconductor for example) can then be deposited on one or both sides of the substrate, as required by the particular device design. Deposition of the conductive layers can be implemented using standard thin film deposition technique such as pulsed laser deposition, sputtering, sol-gel processes, chemical vapor deposition, etc. and patterned as required by the design.

In the description of the invention above, while the fabrication process for making a tunable planar microwave device with patterned ferroelectric thin film is illustrated using YBCO superconducting thin film, barium strontium titanate ferroelectric thin film and LAO single crystal substrate, the invention is not restricted to these materials. The invention is also applicable to other materials (such as perovskite ferroelectrics) that required high deposition and annealing temperatures. Examples include, but not limited to, strontium titanate, barium titanate, potassium tantalate, potassium tantalate niobate etc., as well as their doped derivatives. Substrate can also be materials suitable for the epitaxial deposition of ferroelectric and conductive thin films such as $(LaAlO_3)_{0.3}(Sr_2AlTaO_8)_{0.7}$, $Al_2O_3$, $NdGO_3$, $SrTiO_3$, $MgAl_2O_4$, YSZ, MgO, Si or GaAs with suitable buffer layers. Conductive layers can be materials such as copper perovskites high temperature superconductors or metals such as gold, silver or copper.

We detail below three process embodiments of the invention:

1$^{st}$ Embodiment

Referring now to FIG. 3, this process begins with the provision of substrate 11 (for example LAO) on which is deposited masking layer 41 (for example YBCO). The latter has a thickness between about 0.1 and 10 microns and is patterned to form a negative mask 42 for a thin film, as illustrated in FIG. 4.

Figure 6:
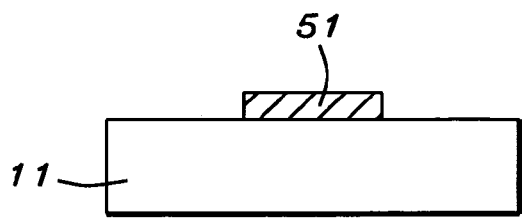

Next, as shown in FIG. 5, the desired film 51 (generally, but not necessarily, a ferroelectric thin film) is grown on all exposed surfaces including mask 41 at a temperature of at least 650° C. It is grown to a thickness between about 0.01 and 1 microns, care being taken to ensure that this thickness value is less than the thickness of mask 41. Then, as seen in FIG. 6, mask 41 is removed so that thin film 51 selectively remains only where it is in direct contact with substrate 11.

Figure 7:
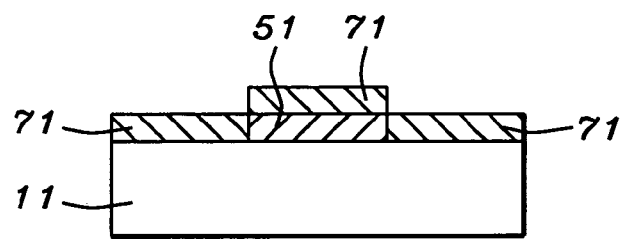
Figure 8:
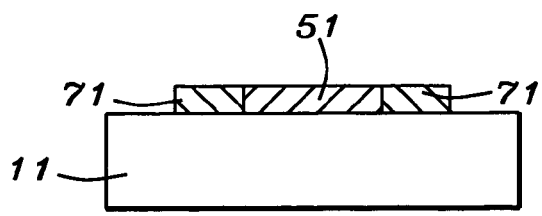

The process concludes with the deposition and patterning of conductive layer 71 as seen in FIGS. 7 and 8. The portion of 71 that rests on film 51 may be removed by planarization followed by patterning of the portion in contact with substrate 11 or both operations may be accomplished in a single step.

Figure 9:
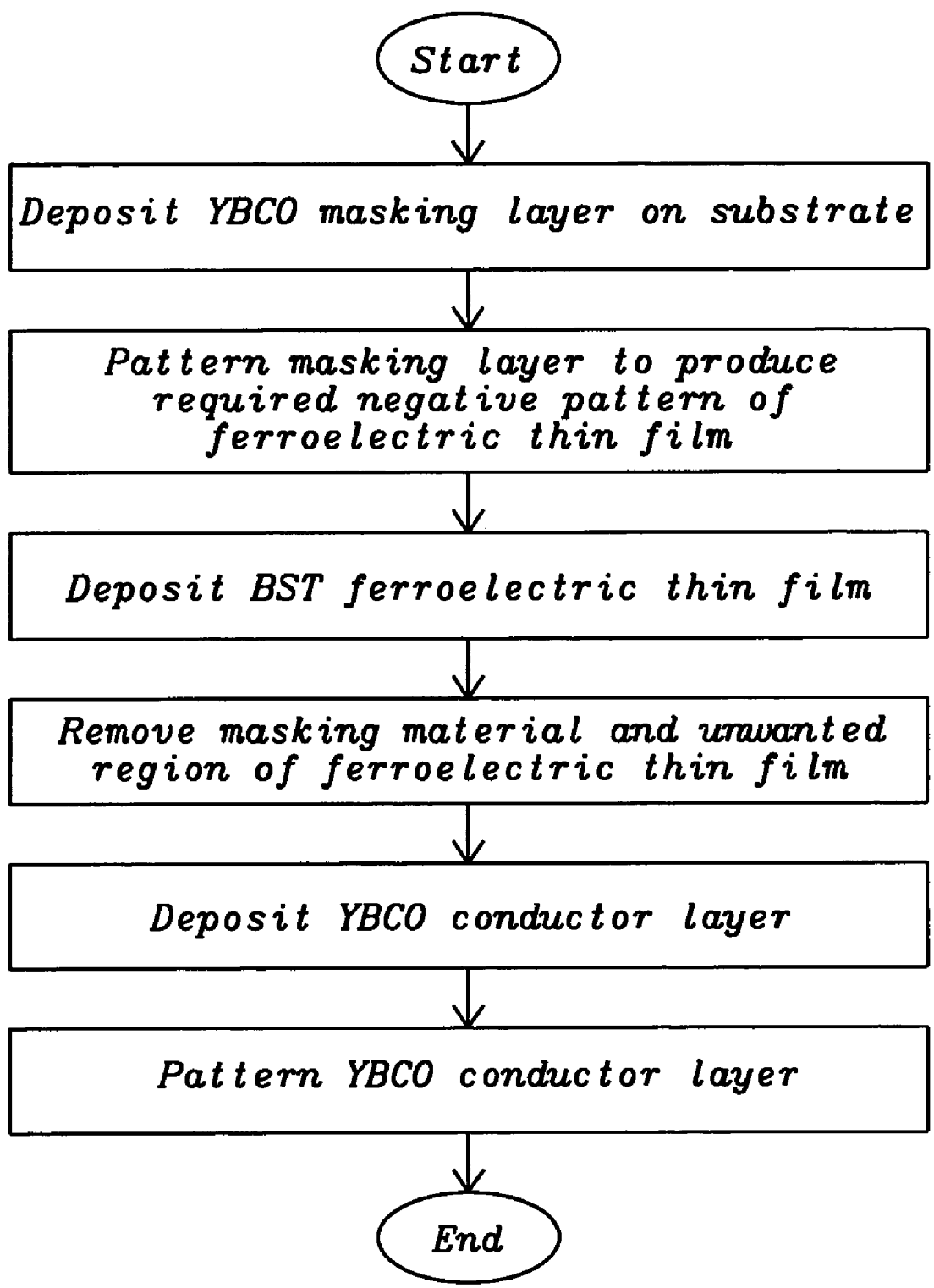
FIG. 9 is a summary of the process of the present invention in flowchart form.

FIG. 9 summarizes the full process of the invention when used with a YBCO masking layer and a BST ferroelectric thin film.

2$^{nd}$ Embodiment

Figure 10:
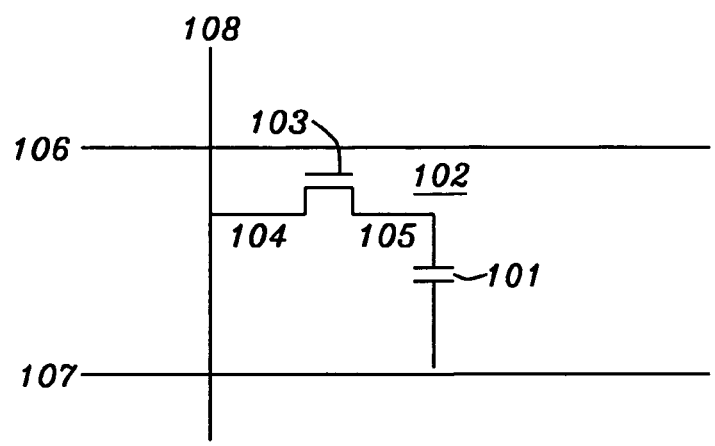
FIG. 10 is a schematic circuit showing a memory storage element based on a ferroelectric layer.

This embodiment, and the one that follows, teaches the formation of a ferroelectric memory element for use in a random access memory. FIG. 10 shows the basic circuit involved. Information (0 or 1) is stored in capacitor element 101 and takes the form of an electric charge polarization across said element, the direction of this polarization being set during writing and sensed during reading. One electrode of capacitor 101 is connected to drain 105 of field effect transistor (FET) 102, the other capacitor electrode being connected to read-write line 107. Gate 103 of FET 102 is connected to word line 106 while source 104 is connected to bit line 108 which is disposed to be orthogonal to both lines 106 and 107.

Figure 11:
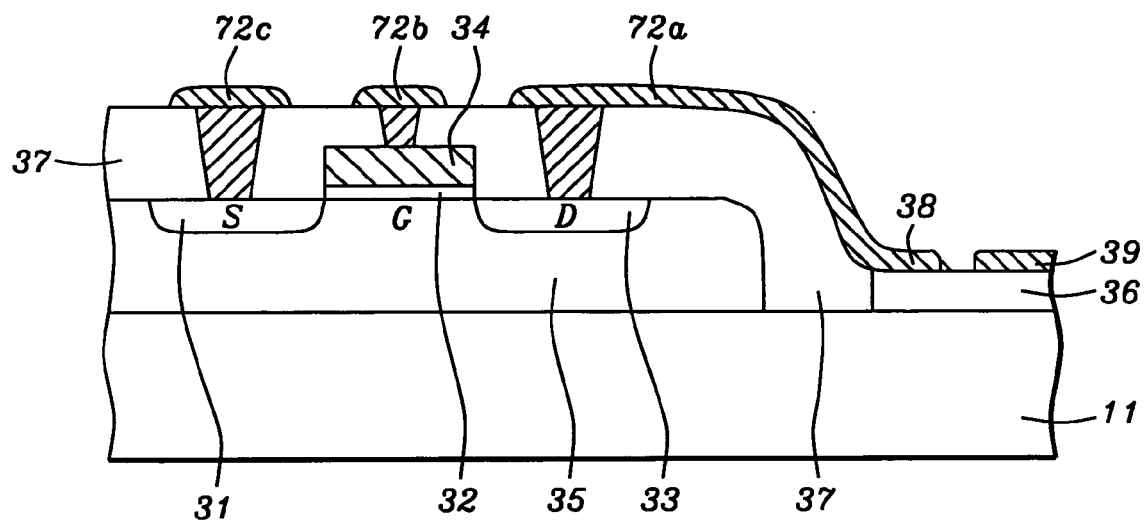
FIG. 11 is a cross-sectional view of a ferroelectric based memory element formed according to the teachings of the present invention, including epitaxial growth of the ferroelectric layer.

The process of the second embodiment is illustrated in FIG. 11 and begins with providing substrate 11 and, in the manner of the first embodiment, ferroelectric capacitor dielectric 36 is epitaxially grown and patterned on substrate 11 in a location adjacent to FET device layer 35 at a substrate temperature of at least 650° C. Then, an FET device having source area 31, drain area 33, and gate dielectric 32 (as well as polysilicon gate 34) is formed on the upper surface of substrate 11. Typically the FET would be formed in a deposited layer 35 of amorphous silicon.

This is followed by the deposition and then patterning of insulating layer 37 so as to form access holes to said source, gate and drain areas as well as to fully uncover capacitor dielectric 36.

Next, coplanar capacitor electrodes 38 and 39 are formed on the top surface of capacitor dielectric 36. Although shown here as single plates, the coplanar electrodes 38 and 39 could have been be implemented in the form of interlacing fingers.

Finally, conductive layer 72 is deposited and then patterned to form connection 72c between source 31 and bit line 108 (see FIG. 10), connection 72b is formed between gate area 34 and word line 106, and connection 72a is formed between drain area 33 and capacitor electrode 38. A connection between capacitor electrode 39 and read-write line 107 is also formed though not shown in the figure. Note that, depending on design considerations, the formation of the capacitor electrodes and the connections mentioned above could have been performed in a single step.

3rd Embodiment

Figure 12:
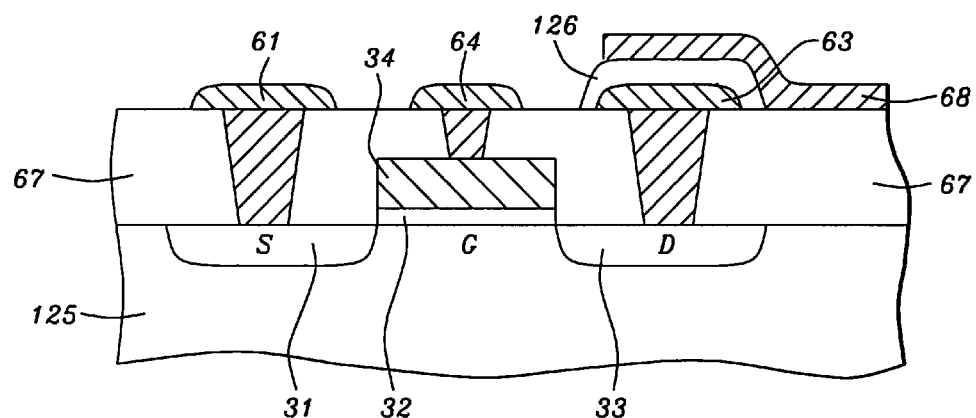
FIG. 12 is a cross-sectional view of a ferroelectric based memory element formed according to the teachings of the present invention except for the absence of epitaxial growth.

The starting point for this embodiment is an FET device, generally part 125 of a silicon chip, as seen in FIG. 12. As in the second embodiment, the FET includes source 31, gate contact 34, and drain 33. This FET device is then coated with insulating layer 67, following which access holes to the source, drain, and gate areas are formed and then over-filled with a conductive material such as tungsten to form source, gate, and drain contacts 61, 64, and 63 respectively.

At this point, ferroelectric capacitor dielectric layer 126 is formed by using a refractory mask after the manner described above for the first embodiment. Although epitaxial growth of the ferroelectric layer to form a single crystal is now no longer possible, by depositing it at a substrate temperature of at least 350° C., followed by a suitable anneal, adequate permittivity for the purposes of a memory storage element can be achieved.

The process concludes with the deposition and patterning of a conductive layer to form upper capacitor electrode 68 as well as connections between source contact 61 and bit line 108 (se FIG. 10), between gate contact 64 and word line 106, and between top capacitor electrode 68 and read-write line 107.

Figure 13:
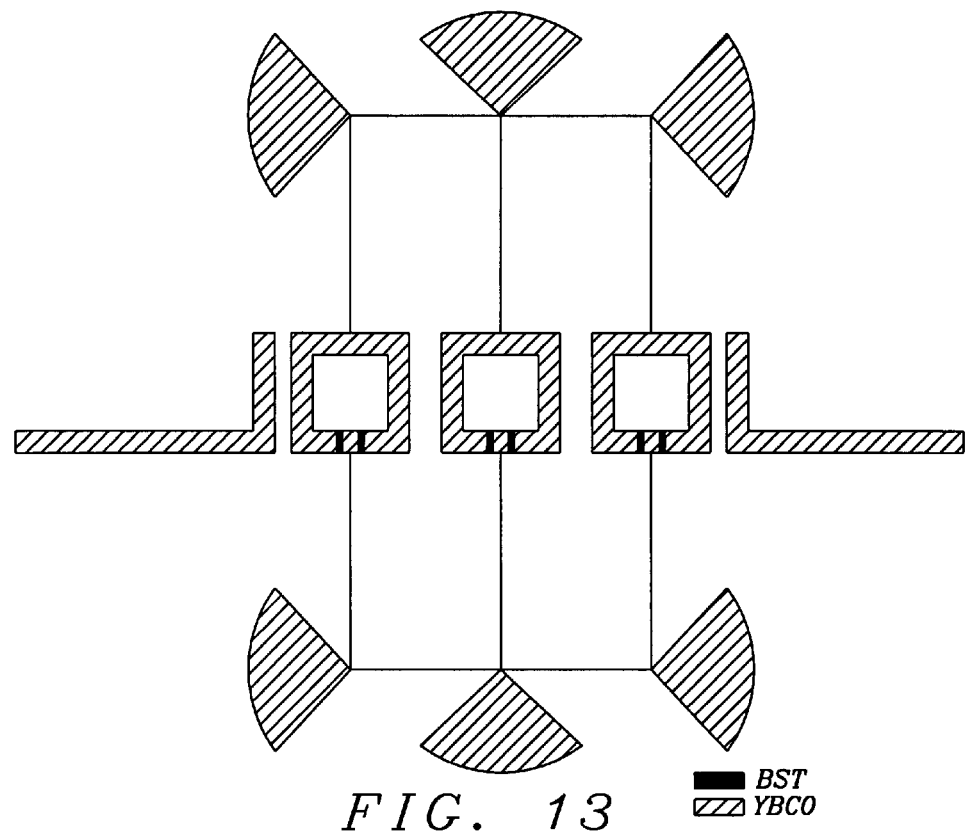
FIG. 13 shows the layout of an electrically tunable microwave filter implemented in accordance with the present invention.
Figure 14:
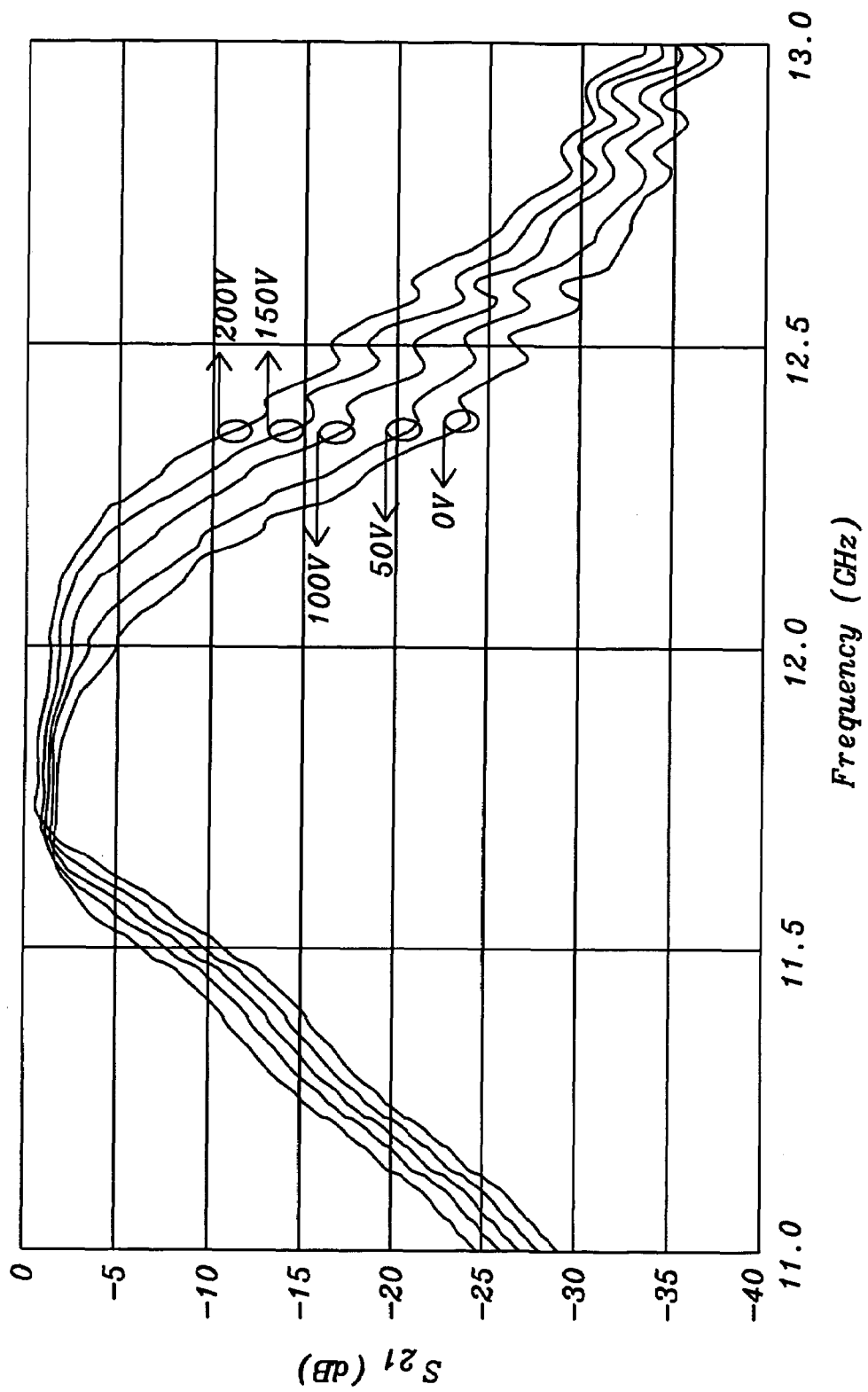
FIG. 14 shows the measured S-parameters data of the filter of FIG. 13.

As an application example of the first embodiment, a three-stage super-conducting YBCO thin film microstrip tunable filter, with patterned BST ferroelectric thin film, was fabricated and is illustrated in FIG. 13. The central frequency of this filter could be tuned between 11.74 and 11.93 GHz when voltage varied from 0 V to 200 V, corresponding to a tunability of 1.56%. Insertion losses varied from 1.6 dB at 0 V to 0.35 dB at 200 V. This is seen in FIG. 14 which is a plot of the measured S (scattering) parameters of this filter as a function of frequency over a range of different applied voltages.

What is claimed is:

1. A process to manufacture a tunable microwave device, comprising:

providing a substrate and depositing thereon a masking layer of material, selected from the group consisting of yttrium barium cuprate, copper oxide, and calcium oxide, to a first thickness;

patterning said masking layer to form a negative mask for a ferroelectric thin film;

at a temperature of at least 650° C., growing said ferroelectric thin film on said mask and substrate, to a second thickness that is less than the first thickness;

then removing said masking material whereby said ferroelectric thin film remains only where it is in direct contact with said substrate, and then depositing and patterning a conductive layer.

2. The process recited in claim 1 wherein said substrate is selected from the group consisting of lanthanum aluminate ($LaAlO_3$), LSAT (($LaAlO_3$)$_{0.3}$($Sr_2AlTaO_8$)$_{0.7}$), sapphire ($Al_2O_3$), neodymium gallate ($NdGaO_3$), strontium titanate ($SrTiO_3$), spinel ($MgAl_2O_4$), yttria stabilized zirconium oxide (YSZ), gallium arsenide (GaAs), silicon (Si), and magnesium oxide (MgO).

3. The process recited in claim 1 wherein said ferroelectric thin film is selected from the group consisting of barium strontium titanate, strontium titanate, barium titanate, potassium tantalate, potassium tantalate niobate, and their doped derivatives.

4. The process recited in claim 1 wherein said substrate is lanthanum aluminate, said masking layer is yttrium barium cuprate, and said ferroelectric thin film is barium strontium titanate.

5. The process recited in claim 1 wherein said first thickness is between about 0.1 and 10 microns and said second thickness is between about 0.01 and 1 microns.

6. The process recited in claim 1 wherein said ferroelectric film is grown epitaxially thereby becoming a single crystal film.

* * * * *